(12) United States Patent
Yamashita et al.

(10) Patent No.: US 6,734,276 B2
(45) Date of Patent: May 11, 2004

(54) POLYIMIDE AND CIRCUIT SUBSTRATE COMPRISING THE SAME

(75) Inventors: Wataru Yamashita, Fukuoka (JP); Katsuji Watanabe, Fukuoka (JP); Takahisa Oguchi, Fukuoka (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/110,302

(22) PCT Filed: Aug. 10, 2001

(86) PCT No.: PCT/JP01/06919

§ 371 (c)(1), (2), (4) Date: Apr. 11, 2002

(87) PCT Pub. No.: WO02/14406

PCT Pub. Date: Feb. 21, 2002

(65) Prior Publication Data

US 2003/0013838 A1 Jan. 16, 2003

(30) Foreign Application Priority Data

Aug. 11, 2000 (JP) .......................... 2000-244418

(51) Int. Cl.$^7$ .......................... C08G 73/10; C08L 79/08; B32B 27/34
(52) U.S. Cl. .......................... 528/170; 528/125; 528/126; 528/128; 528/172; 528/173; 528/176; 528/183; 528/185; 528/188; 528/220; 528/229; 528/350; 528/351; 528/353; 525/282; 524/600; 524/607; 428/457; 428/458; 428/411.1; 428/473.5; 428/901
(58) Field of Search .......................... 528/170, 125, 528/126, 128, 172–173, 176, 183, 185, 353, 188, 220, 229, 350, 351; 428/473.5, 411.1, 901, 457, 458; 524/600, 607; 525/282

(56) References Cited

U.S. PATENT DOCUMENTS

| | | | |
|---|---|---|---|
| 4,874,835 A | | 10/1989 | Berdahl |
| 5,171,828 A | * | 12/1992 | Meterko et al. ............ 528/353 |
| 5,286,840 A | * | 2/1994 | Oikawa et al. ............ 528/353 |
| 6,335,416 B1 | * | 1/2002 | Nojiri et al. ............ 528/170 |
| 6,548,179 B2 | * | 4/2003 | Uhara et al. ............ 428/473.5 |
| 6,555,238 B2 | * | 4/2003 | Uhara et al. ............ 428/458 |

FOREIGN PATENT DOCUMENTS

| | | |
|---|---|---|
| JP | 63-199236 | 8/1988 |
| JP | 10-7906 | 1/1998 |
| JP | 11-12358 | 1/1999 |

\* cited by examiner

*Primary Examiner*—P. Hampton Hightower
(74) *Attorney, Agent, or Firm*—Burns, Doane, Swecker & Mathis, LLP

(57) ABSTRACT

The invention is a polyimide, random copolymer having repeating units of the formula (1):

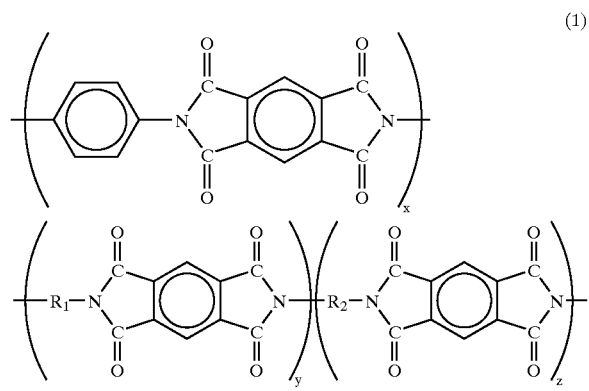

wherein $R_1$ and $R_2$ each represent a divalent group selected from

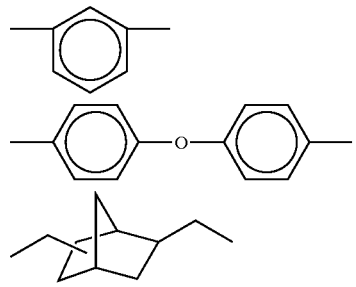

and $R_1$ and $R_2$ may be the same or different; and x=0.60 to 0.80, y+z=0.40 to 0.20, and x+y+z=1.00, and a linear expansion coefficient at 100 to 200° C. is in the range of from 10 to 20 ppm/K. This is a useful polyimide that can be a polyimide circuit substrate material capable of keeping flat, neither shrinking nor expanding in its laminate.

12 Claims, No Drawings

POLYIMIDE AND CIRCUIT SUBSTRATE COMPRISING THE SAME

TECHNICAL FIELD

The present invention relates to a polyimide that comprises specific repeating structural units and has good thermal resistance, mechanical properties and chemical resistance. Additionally, for polyimide/metal leaf laminates that are said to be especially important in the field of electronic materials, the invention relates to a useful polyimide which is so designed that its linear expansion coefficient approximates that of metal leaf and which can be a polyimide circuit substrate material capable of keeping flat, neither shrinking nor expanding in its laminate.

BACKGROUND ART

The linear expansion coefficient (thermal expansion coefficient) of most organic polymers is at least 50 ppm/K even in a temperature range not higher than the glass transition temperature thereof, and is much higher than that of metals and inorganic substances. Therefore, metal/polymer composites, for example, metal leaf/organic polymer laminates involve serious problems of warping, deformation, delamination, cracking of the polymer layer and disruption of the substrate itself because of the difference in the linear expansion coefficient between the constituent components.

In that problematic situation, polyimide having good thermal resistance and good mechanical properties has heretofore been used as an organic polymer that solves the problems.

For example, the polyimide represented by the formula (A):

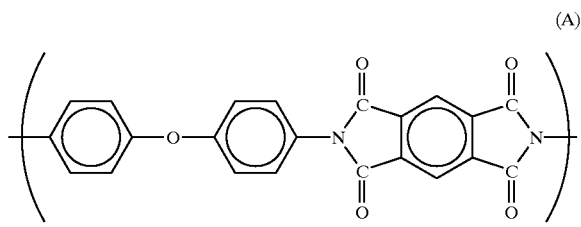

(A)

has been known as a typical example. This is a resin having good thermal resistance and good mechanical properties, and is widely used for electronic materials. However, its linear expansion coefficient is about 40 ppm/K (in the temperature range of 100 to 200° C.), and the polyimide is still unsatisfactory for a constituent component of laminates.

On the other hand, the polyimide represented by the formula (B):

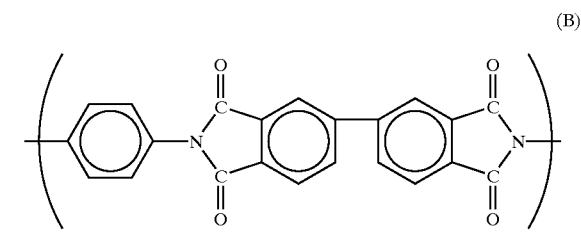

(B)

also has good thermal resistance and good mechanical properties, and its linear expansion coefficient is extremely low. Concretely, however, the linear expansion coefficient of the polyimide is at most 10 ppm/K (in the temperature range of 100 to 200° C.), and contrary to the above, it is lower than the linear expansion coefficient of metal.

Recently, other polyimides having a low linear expansion coefficient (low stress) have been developed to solve these problems. For example, in Japanese Patent Laid-Open Nos. 191830/1988, 199236/1988, 16829/1989, 20232/1989, 33134/1989 and 38437/1989, alkyl chains such as methyl groups are introduced into rigid polyimide main chain skeletons to lower the linear expansion coefficient of the thus-modified polyimides. However, these polyimides (or their precursors, polyamic acids) are problematic in that the polymer component deposits in the varnish thereof when stored long. Another problem with them is that, since they have many alkyl groups introduced thereinto, the methyl groups therein are oxidized when they are exposed to high temperatures.

In Japanese Patent Laid-Open Nos. 153934/1990 and 251584/1990, disclosed are polyimides having rigid hetero rings such as imidazole introduced thereinto. However, the hetero ring-having monomers for them require complicated steps in their production, and their costs inevitably increase.

A polyimide having a controlled linear expansion coefficient useful for polyimide/metal leaf has not as yet been realized. In that situation, a technique for controlling the linear expansion coefficient of polyimide through stretching and orientation is known. However, the technique requires an additional secondary step, and is therefore problematic in practical use.

As mentioned hereinabove, a polyimide satisfactory for laminates of polyimide/metal leaf is not as yet found out, and a polyimide that solves the problems noted above is desired.

DISCLOSURE OF THE INVENTION

The object of the present invention is to provide a polyimide having a suitable linear expansion coefficient that corresponds to the linear expansion coefficient of metal leaf (in this case, in the range of 10 to 20 ppm/K at the temperature range of 100 to 200° C.) in addition to good properties inherent to polyimides, that is, good thermal resistance, mechanical properties and chemical resistance. More precisely, it is to provide a useful polyimide which can be a polyimide circuit substrate material capable of keeping flat, neither shrinking nor expanding in its laminate.

The present inventors have assiduously studied to attain the object mentioned above and, as a result, have found that a polyimide obtained through thermal imidation of a polyamic acid copolymer, which is prepared by reacting a) pyromellitic acid dianhydride selected for a tetracarboxylic acid dianhydride component with b) a diamine component of essentially paraphenylenediamine combined with 4,4'-oxydianiline or two diamines selected from 4,4'-oxydianiline, metaphenylenediamine and diaminomethyl-bicyclo[2.2.1]heptanes in a specific composition ratio, satisfies the necessary linear expansion coefficient and therefore solves the problems noted above. On the basis of this finding, the present invention has been completed.

Specifically, the invention relates to the following:

1) A polyimide, which is a random copolymer having repeating units represented by the formula (1):

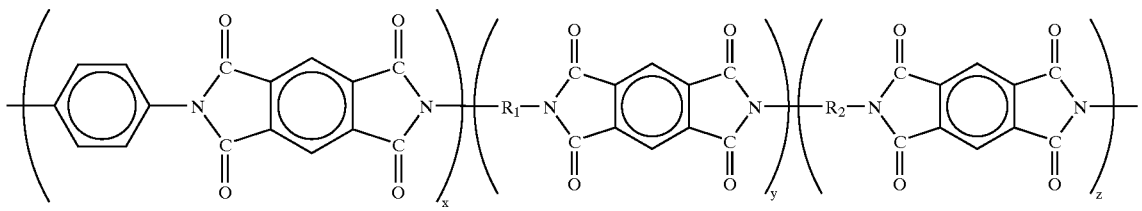
(1)

wherein $R_1$ and $R_2$ each represent a divalent group selected from

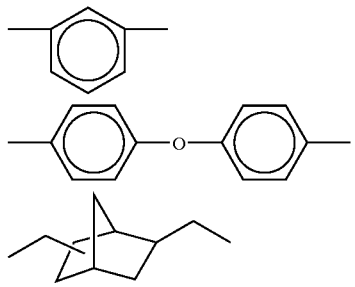

and $R_1$ and $R_2$ may be the same or different; and $x=0.60$ to $0.80$, $y+z=0.40$ to $0.20$, and $x+y+z=1.00$, and which has a linear expansion coefficient of the range of 10 to 20 ppm/K at 100 to 200° C.;

2) The polyimide of above 1, which is a random copolymer having repeating units represented by the formula (2):

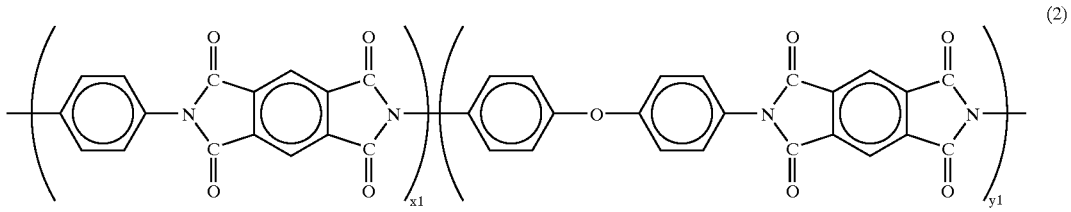
(2)

wherein $x1=0.60$ to $0.80$, $y1=0.40$ to $0.20$, and $x1+y1=1.00$, and which has a linear expansion coefficient of the range of 10 to 20 ppm/K at 100 to 200° C.;

3) The polyimide of above 1, which is a random copolymer having repeating units represented by the formula (3):

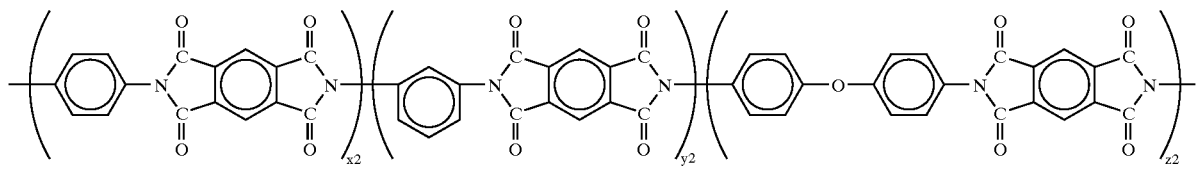
(3)

wherein $x2=0.60$ to $0.80$, $y2=0.35$ to $0.05$, $z2=0.05$ to $0.15$, and $x2+y2+z2=1.00$, and which has a linear expansion coefficient of the range of 10 to 20 ppm/K at 100 to 200° C.;

4) The polyimide of above 1, which is a random copolymer having repeating units represented by the formula (4):

(4)

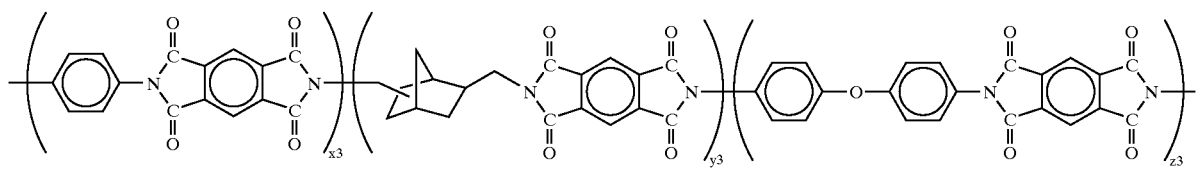

wherein x3=0.65 to 0.75, y3=0.30 to 0.10, z3=0.05 to 0.15, and x3+y3+z3=1.00, and which has a linear expansion coefficient of the range of 10 to 20 ppm/K at 100 to 200° C.;

5) The polyimide of above 1, which is a random copolymer having repeating units represented by the formula (5):

(5)

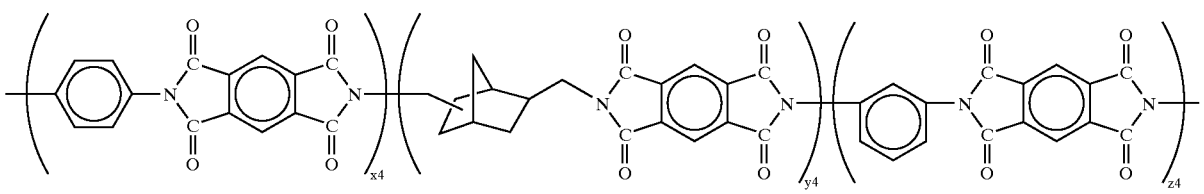

wherein x4=0.65 to 0.75, y4=0.05 to 0.15, z4=0.30 to 0.10, and x4+y4+z4=1.00, and which has a linear expansion coefficient of the range of 10 to 20 ppm/K at 100 to 200° C.;

6) The polyimide of above 1, of which the precursor, polyamic acid has a number-average molecular weight (Mn) of at least 40,000, a weight-average molecular weight (Mw) of at least 60,000, and a molecular weight distribution (Mw/Mn) being in the range of 1.6 to 2.3;

7) A process for preparing the polyimide of above 1, which comprises reacting 1 equivalent mol of pyromellitic acid dianhydride of the formula (6):

(6)

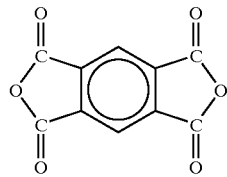

with from 0.9 to 1.1 equivalent mols of a diamine mixture that comprises from 60 to 80 mol % of a diamine of the formula (7):

(7)

and from 40 to 20 mol % of diamines of the formulae (16) and (17):

$H_2N-R_1-NH_2$      (16)

$H_2N-R_2-NH_2$      (17)

wherein $R_1$ and $R_2$ each represent a divalent group selected from

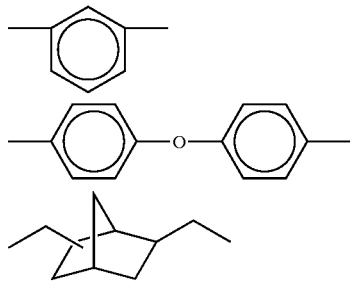

and $R_1$ and $R_2$ may be the same or different, in an organic solvent, followed by thermally imidizing the resulting random copolymer, polyamic acid having repeating units represented by the formula (15):

(15)

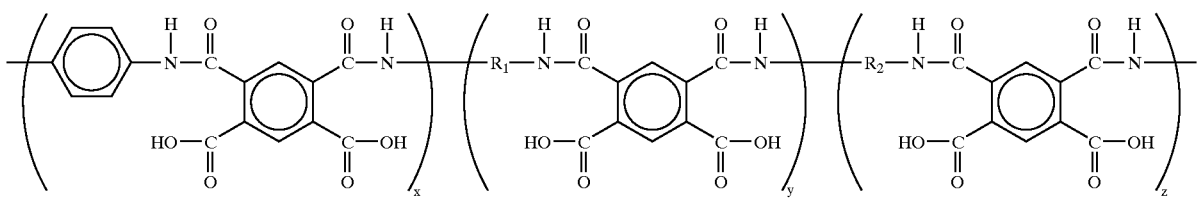

wherein $R_1$ and $R_2$ each represent a divalent group selected from

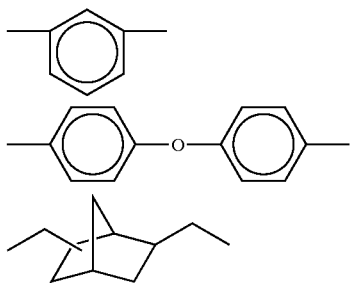

and $R_1$ and $R_2$ may be the same or different; and x=0.60 to 0.80, y+z=0.40 to 0.20, and x+y+z=1.00;

8) A process for preparing the polyimide of above 2, which comprises reacting 1 equivalent mol of pyromellitic acid dianhydride of the formula (6):

(6)

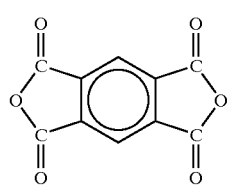

with from 0.9 to 1.1 equivalent mols of a diamine mixture that comprises from 60 to 80 mol % of paraphenylenediamine of the formula (7):

(7)

and from 40 to 20 mol % of 4,4'-oxydianiline of the formula (8):

(8)

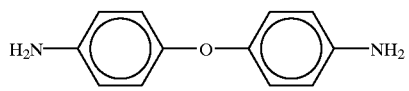

in an organic solvent, followed by thermally imidizing the resulting random copolymer, polyamic acid having repeating units represented by the formula (9):

(9)

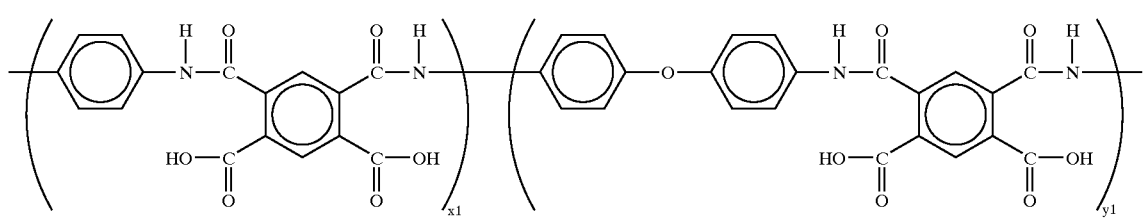

wherein x1=0.60 to 0.80, y1=0.40 to 0.20, and x1+y1=1.00;

9) A process for preparing the polyimide of above 3, which comprises reacting 1 equivalent mol of pyromellitic acid dianhydride of the formula (6):

(6)

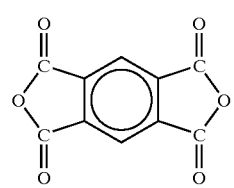

with from 0.9 to 1.1 equivalent mols of a diamine mixture that comprises from 60 to 80 mol % of paraphenylenediamine of the formula (7):

(7)

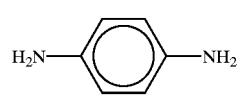

from 5 to 15 mol % of 4,4'-oxydianiline of the formula (8):

(8)

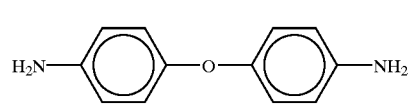

and from 35 to 5 mol % of metaphenylenediamine of the formula (10):

(10)

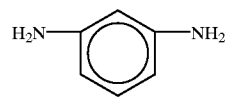

in an organic solvent, followed by thermally imidizing the resulting random copolymer, polyamic acid having repeating units represented by the formula (11):

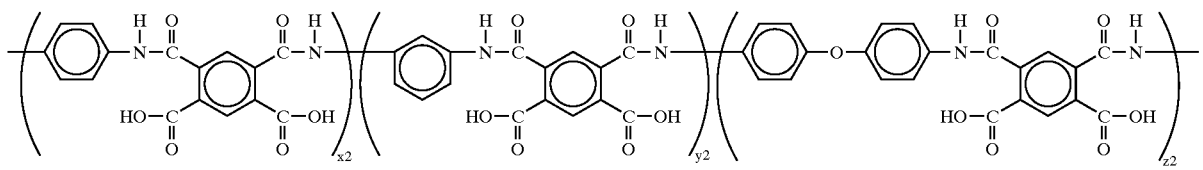

wherein x2=0.60 to 0.80, y2=0.35 to 0.05, z2=0.05 to 0.15, and x2+y2+z2=1.00;

10) A process for preparing the polyimide of above 4, which comprises reacting 1 equivalent mol of pyromellitic acid dianhydride of the formula (6):

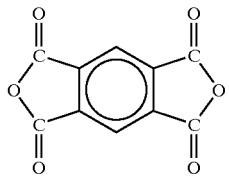

(6)

with from 0.9 to 1.1 equivalent mols of a diamine mixture that comprises from 65 to 75 mol % of paraphenylenediamine of the formula (7):

(7)

from 5 to 15 mol % of 4,4'-oxydianiline of the formula (8):

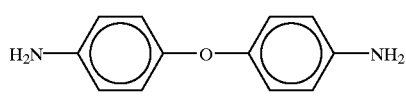

(8)

and from 30 to 10 mol % of diaminomethyl-bicyclo[2.2.1]heptanes of the formula (12):

(12)

in an organic solvent, followed by thermally imidizing the resulting random copolymer, polyamic acid having repeating units represented by the formula (13):

wherein x3=0.65 to 0.75, y3=0.30 to 0.10, z3=0.05 to 0.15, and x3+y3+z3=1.00;

11) A process for preparing the polyimide of above 5, which comprises reacting 1 equivalent mol of pyromellitic acid dianhydride of the formula (6):

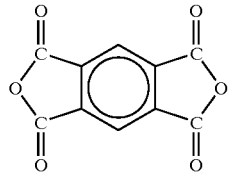

(6)

with from 0.9 to 1.1 equivalent mols of a diamine mixture that comprises from 65 to 75 mol % of paraphenylenediamine of the formula (7):

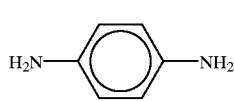

(7)

from 30 to 10 mol % of metaphenylenediamine of the formula (10):

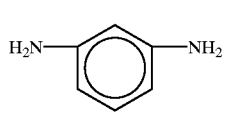

(10)

and from 5 to 15 mol % of diaminomethyl-bicyclo[2.2.1]heptanes of the formula (12):

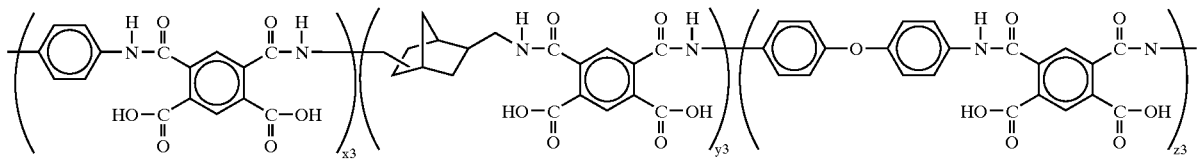

(13)

(12)

in an organic solvent, followed by thermally imidizing the resulting random copolymer polyamic acid having repeating units represented by the formula (14):

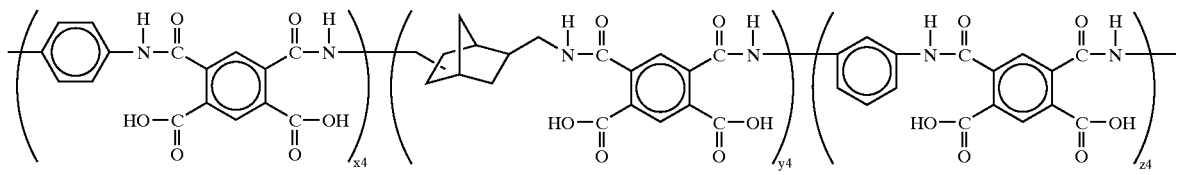

(14)

wherein x4=0.65 to 0.75, y4=0.05 to 0.15, z4=0.30 to 0.10, and x4+y4+z4=1.00;

12) A polyamic acid varnish, which contains a precursor of the polyimide of above 1, or that is, a random copolymer, polyamic acid having repeating units represented by the formula (15):

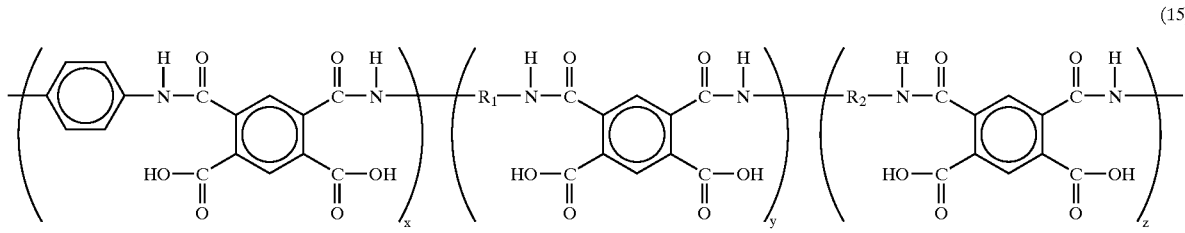

(15)

wherein $R_1$ and $R_2$ each represent a divalent group selected from

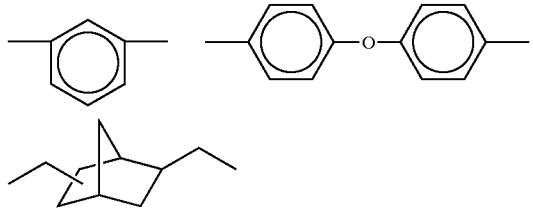

and $R_1$ and $R_2$ may be the same or different; and x=0.60 to 0.80, y+z=0.40 to 0.20, and x+y+z=1.00;

13) A polyimide film containing the polyimide of above 1;
14) A polyimide circuit substrate, which is a laminate of the polyimide of above 1 and metal leaf.

BEST MODES OF CARRYING OUT THE INVENTION

The polyimide of the invention is a polyimide copolymer of formula (1), precisely, formulae (2) to (5).

Indicating the polyimide copolymer, these formulae show one repeating unit of the copolymer formed through reaction of pyromellitic acid dianhydride with the respective diamines, and the repeating unit shows the composition ratio of the polyimide units that constitute the copolymer. Therefore, in the copolymer of the invention, the constitutive polyimide units are not specifically defined in point of the sequence regularity and the sequence order, but are at random.

In the invention, the tetracarboxylic dianhydride component essential to the polyimide copolymer is pyromellitic acid dianhydride of the formula (6):

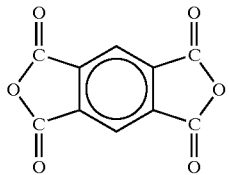

(6)

The acid dianhydride is selected and combined with a diamine component mentioned below to give a polyimide copolymer, and the resulting polyimide has the desired linear expansion coefficient.

Any other tetracarboxylic dianhydride may be used herein, not interfering with the effect of the invention, but its amount is generally at most 10 mol % of all the tetracarboxylic dianhydride used herein, preferably at most 5 mol % thereof.

Concrete examples of the additional tetracarboxylic dianhydrides are, for example,
3,3',4,4'-biphenyltetracarboxylic dianhydride,
2,3,3',4'-biphenyltetracarboxylic dianhydride,
3,3',4,4'-benzophenonetetracarboxylic dianhydride,
bis(3,4-dicarboxyphenyl)ether dianhydride,
bis(3,4-dicarboxyphenyl)sulfide dianhydride, bis(3,4-dicarboxyphenyl)sulfone dianhydride,
bis(3,4-dicarboxyphenyl)methane dianhydride,
2,2-bis(3,4-dicarboxyphenyl)propane dianhydride,
2,2-bis(3,4-dicarboxyphenyl)-1,1,1,3,3,3-hexafluoropropane dianhydride,
1,3-bis(3,4-dicarboxyphenoxy)benzene dianhydride,
1,4-bis(3,4-dicarboxyphenoxy)benzene dianhydride,
4,4'-bis(3,4-dicarbophenoxy)biphenyl dianhydride,
2,2-bis[(3,4-dicarboxyphenoxy)phenyl]propane dianhydride,
2,3,6,7-naphthalenetetracarboxylic dianhydride,
1,4,5,8-naphthalenetetracarboxylic dianhydride,
butane-1,2,3,4-tetracarboxylic dianhydride,
pentane-1,2,4,5-tetracarboxylic dianhydride,
cyclobutanetetracarboxylic dianhydride,
cyclopentane-1,2,3,4-tetracarboxylic dianhydride,
cyclohexane-1,2,4,5-tetracarboxylic dianhydride,
cyclohexa-1-ene-2,3,5,6-tetracarboxylic dianhydride,
3-ethylcyclohexa-1-ene-3-(1,2),5,6-tetracarboxylic dianhydride,
1-methyl-3-ethylcyclohexane-3-(1,2),5,6-tetracarboxylic dianhydride,
1-methyl-3-ethylcyclohexa-1-ene-3-(1,2),5,6-tetracarboxylic dianhydride,
1-ehtylcyclohexane-1-(1,2)3,4-tetracarboxyic dianhydride,
1-propylcyclohexane-1-(2,3),3,4-tetracarboxylic dianhydride,
1,3-dipropylcyclohexane-1-(2,3),3-(2,3)-tetracarboxylic dianhydride,
dicyclohexyl-3,4,3',4'-tetracaroxylic dianhydride,
bicyclo[2.2.1]heptane-2,3,5,6-tetracarboxylic dianhydride,
bicyclo[2.2.2]octane-2,3,5,6-tetracarboxylic dianhydride,
bicyclo[2.2.2]octo-7-ene-2,3,5,6-tetracarboxylic dianhydride, and the like.

These tetracarboxylic acid dianhydrides may be used herein either singly or as combined at the same time.

On the other hand, the diamine component to form the polyimide copolymer of the invention is as follows:

a) The essential diamine is paraphenylenediamine (also referred to as 1,4-diaminobenzene) of the formula (7):

(7)

b) The other diamines to be combined with the essential paraphenylenediamine are:

4,4'-oxydianiline (also referred to as 4,4'-diaminodiphenyl ether) of the formula (8):

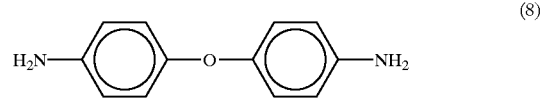

(8)

metaphenylenediamine (also referred to as 1,3-diaminobenzene) of the formula (10):

(10)

and diaminomethyl-bicyclo[2.2.1]heptanes of the formula (12):

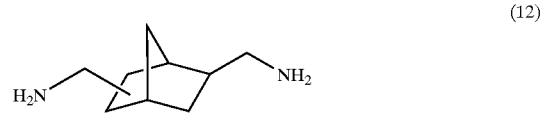

(12)

Of these diamines, the diamine of formula (8) alone, or two diamines of formulae (8) and (10), or formulae (10) and (12) or formulae (8) and (12) are combined with the diamine of the formula (7).

The diaminomethyl-bicyclo[2.2.1]heptanes may be in any form of their isomers, but are essentially 2,5-diaminomethyl-bicyclo[2.2.1]heptane or 2,6-diaminomethyl-bicyclo[2.2.1]heptane, including their stereoisomers.

The diaminomethyl-bicyclo[2.2.1]heptanes may be in the form of a mixture of their isomers.

The polyimide copolymer of the invention is obtained through thermal imidation of a random copolymer, polyamic acid copolymer prepared by reacting the tetracarboxylic acid dianhydride mentioned above with two or three diamines also mentioned above, and it is represented by the formula (1), precisely formulae (2), (3), (4) and (5).

Specifically, the polyimide copolymer of the invention includes the following:

<1> A Polyimide Copolymer Having Repeating Units Represented by the Formula (1):

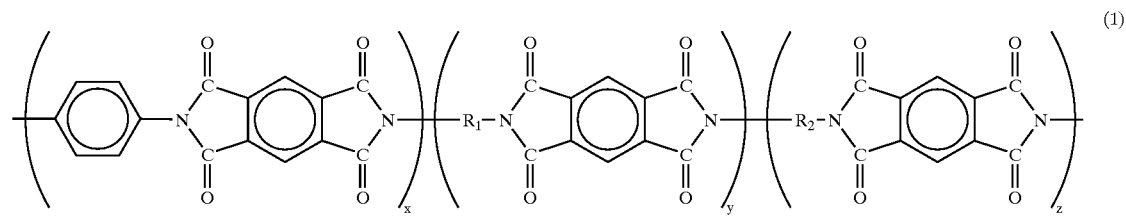

(1)

wherein $R_1$, $R_2$, x, y and Z have the same meanings as above, which is obtained by reacting 1 equivalent mol of a tetracarboxylic acid dianhydride, pyromellitic acid dianhydride of the formula (6):

and $R_1$ and $R_2$ may be the same or different, in an organic solvent, followed by thermally imidizing the resulting random copolymer, polyamic acid copolymer having repeating units represented by the formula (15):

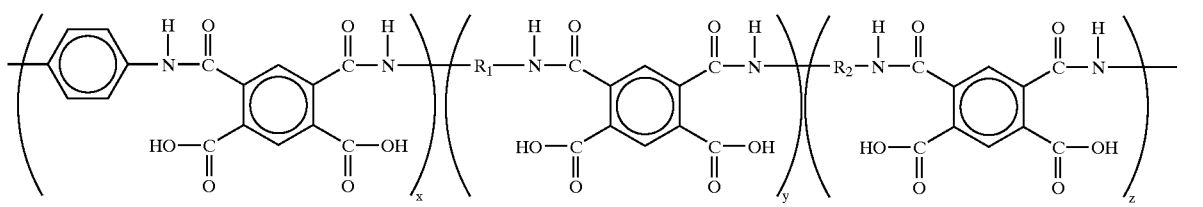

(15)

(6)

with from 0.9 to 1.1 equivalent mols of a diamine mixture that comprises from 60 to 80 mol % of phenylenediamine of the formula (7):

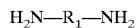

(7)

and from 40 to 20 mol % of diamines of the formulae (16) and (17):

$H_2N-R_1-NH_2$ (16)

$H_2N-R_2-NH_2$ (17)

wherein $R_1$ and $R_2$ each represent a divalent group selected from

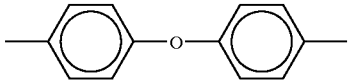

and $R_1$ and $R_2$ may be the same or different; and x=0.60 to 0.80, y+z=0.40 to 0.20, and x+y+z=1.00;

<2> A polyimide copolymer having repeating units represented by the formula (2)

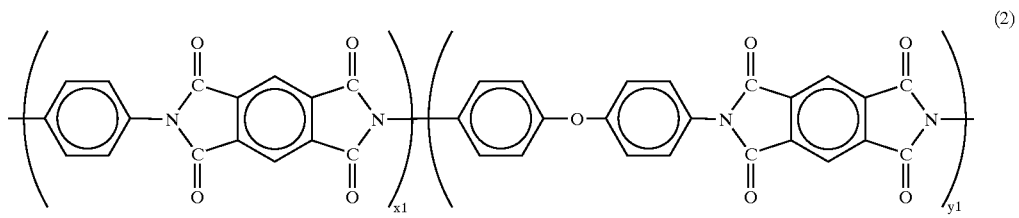

(2)

wherein $R_1$ and $R_2$ each represent a divalent group selected from

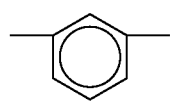
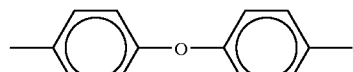
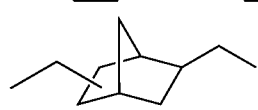

wherein x1 and y1 have the same meanings as above, which is obtained by reacting 1 equivalent mol of a tetracarboxylic acid dianhydride, pyromellitic acid dianhydride with from 0.9 to 1.1 equivalent mols of a diamine mixture that comprises from 60 to 80 mol % of paraphenylenediamine of the formula (7):

(7)

and from 40 to 20 mol % of 4,4'-oxydianiline of the formula (8):

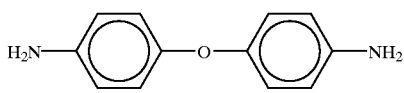

followed by thermally imidizing the resulting random copolymer, polyamic acid copolymer having repeating units represented by the formula (9):

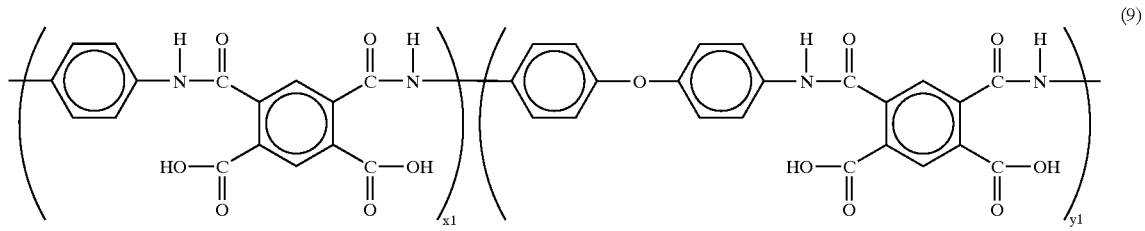

wherein x1 and y1 have the same meaning as above;

<3> A polyimide copolymer having repeating units represented by the formula (3):

preferably a polyimide copolymer of formula (3) wherein x2=0.60 to 0.80, y2=0.30 to 0.10, z2=0.10, and x2+y2+z2=1.00, which is obtained by reacting 1 equivalent mol of pyromellitic acid dianhydride with from 0.9 to 1.1 equivalent mols of a diamine mixture that comprises from 60 to 80 mol % of paraphenylenediamine of the formula (7), 10 mol % of 4,4'-oxydianiline of the formula (8) and from 30 to 10 mol % of metaphenylenediamine of the formula (10), in an organic solvent, followed by thermally imidizing the resulting random copolymer, polyamic acid copolymer;

<4> A polyimide copolymer having repeating units represented by the formula (4):

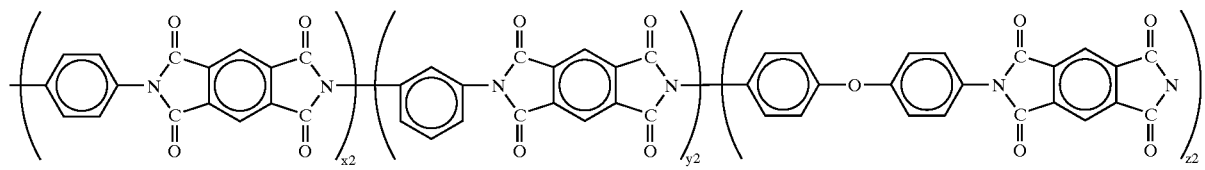

wherein x2, y2 and z2 have the same meanings as above, which is obtained by reacting 1 equivalent mol of a tetracarboxylic acid dianhydride, pyromellitic acid dianhydride with from 0.9 to 1.1 equivalent mols of a diamine mixture that comprises from 60 to 80 mol % of paraphenylenediamine of the formula (7), from 5 to 15 mol % of 4,4'-oxydianiline of the formula (8), and from 5 to 35 mol % of metaphenylenediamine of the formula (10):

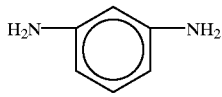

followed by thermally imidizing the resulting random copolymer, polyamic acid copolymer represented by the formula (11):

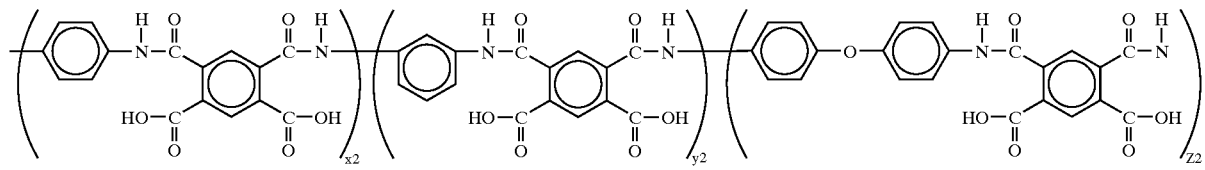

(4)

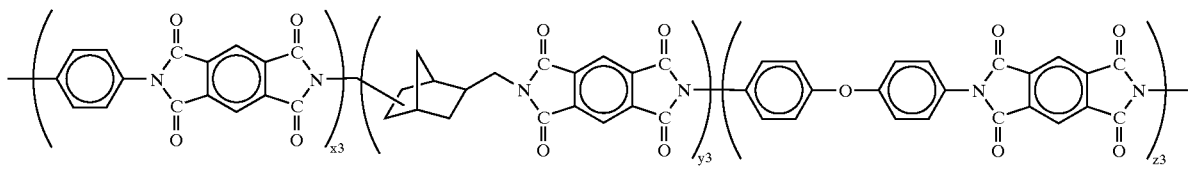

wherein x3, y3 and z3 have the same meanings as above, which is obtained by reacting 1 equivalent mol of a tetra-carboxylic dianhydride, pyromellitic acid dianhydride with from 0.9 to 1.1 equivalent mols of a diamine mixture that comprises from 65 to 75 mol % of paraphenylenediamine of the formula (7), from 5 to 15 mol % of 4,4'-oxydianiline of the formula (8), and from 30 to 10 mol % of diaminomethyl-bicyclo [2.2.1] heptanes of the formula (12):

(12)

followed by thermally imidizing the resulting random copolymer, polyamic acid copolymer represented by the formula (13):

wherein x4, y4 and z4 have the same meanings as above, which is obtained by reacting 1 equivalent mol of a tetra-carboxylic acid dianhydride, pyromellitic acid dianhydride with from 0.9 to 1.1 equivalent mols of a diamine mixture that comprises from 65 to 75 mol % of paraphenylenediamine of the formula (7), from 30 to 10 mol % of metaphenylenediamine of the formula (10) and from 5 to 15 mol % of diaminomethyl-bicyclo [2.2.1] heptanes of the formula (12), followed by thermally imidizing the resulting random copolymer, polyamic acid copolymer represented by the formula (14):

(13)

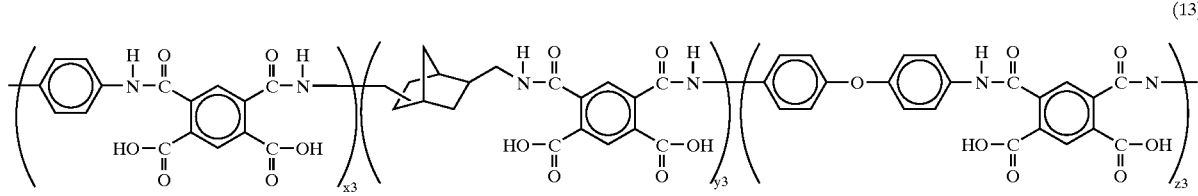

preferably a polyimide copolymer of the formula (4) wherein x3=0.65 to 0.75, y3=0.25 to 0.15, z3=0.10, and x3+y3+z3=1.00, which is obtained by reacting 1 equivalent mol of pyromellitic acid dianhydride with from 0.9 to 1.1 equivalent mols of a diamine mixture that comprises from 65 to 75 mol % of paraphenylenediamine of the formula (7), 10 mol % of oxydianiline of the formula (8) and from 25 to 15 mol % of diaminomethyl-bicyclo [2.2.1] heptanes of the formula (12), in an organic solvent, followed by thermally imidizing the resulting random copolymer, polyamic acid copolymer;

<5> A polyimide copolymer having repeating units represented by the formula (5):

(5)

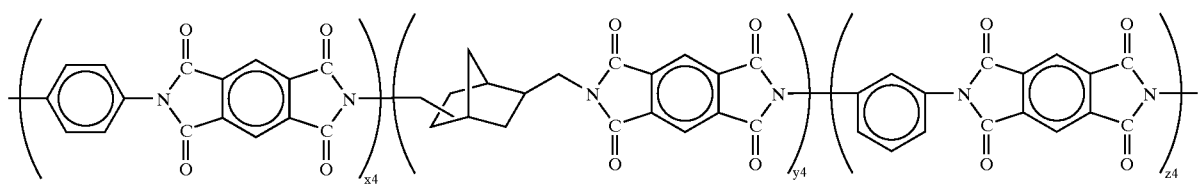

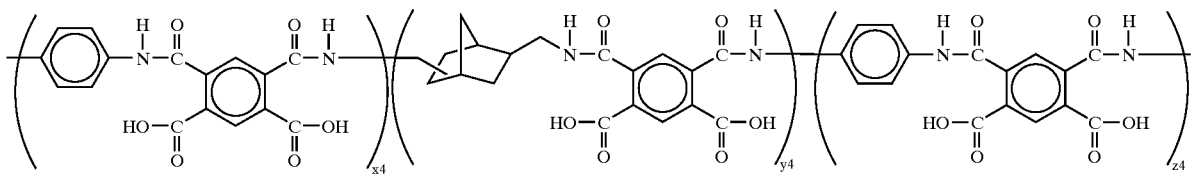

(14)

preferably a polyimide copolymer of the formula (5) wherein x4=0.65 to 0.75, y4=0.10, z4=0.25 to 0.15, and x4+y4+z4=1.00, which is obtained by reacting 1 equivalent mol of pyromellitic acid dianhydride with from 0.9 to 1.1 equivalent mols of a diamine mixture that comprises from 65 to 75 mol % of paraphenylenediamine, from 25 to 15 mol % of metaphenylenediamine and 10 mol % of diaminomethyl-bicyclo [2.2.1] heptanes of the formulae (7), (10) and (12), respectively, in an organic solvent, followed by thermally imidizing the resulting random copolymer, polyamic acid copolymer.

The polyimide copolymer of the invention has repeating units mentioned above, and its linear expansion coefficient at 100 to 200° C. is in the range of 10 to 20 ppm/K.

In general, the molecular weight of the polyimide copolymer of the invention is controlled by controlling the blend ratio of the starting tetracarboxylic acid dianhydride and diamine compounds for the copolymer. Generally, the molar ratio of all the diamine component to all the acid dianhydride component in producing the polyimide copolymer must be made in the range of 0.9 to 1.1.

The polymer molecule terminals of the polyimide copolymer represented by any of the above-mentioned formulae may be blocked or not.

Preferably, the polymer molecule terminals are blocked with a group not reactive with amines or dicarboxylic anhydrides. Concretely, it is desirable that the polymer molecule terminals of the polyamic acid copolymer and the polyimide copolymer having repeating units of formulae mentioned above are blocked with an aromatic dicarboxylic anhydride represented by the formula (16):

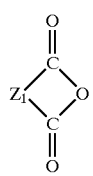

(16)

wherein $Z_1$ is a divalent group having from 6 to 15 carbon atoms, and selected from the group consisting of a monocyclic aromatic group, a condensed polycyclic aromatic group, and a non-condensed polycyclic aromatic group which is composed of aromatic groups mutually bonded to each other either directly or via a crosslinking member.

Concretely, the aromatic dicarboxylic anhydride of the formula (16) includes, for example,
phthalic anhydride,
4-phenylphthalic anhydride,
4-phenoxyphthalic anhydride,
4-phenysulfinylphthalic anhydride,
4-phenylsulfonylphthalic anhydride,
4-phenylcarbonylphthalic anhydride,
4-(2-phenylisopropyl)phthalic anhydride,
4-(1,1,1,3,3,3-hexafluoro-2-phenylisopropyl)phthalic anhydride, 1,8-naphtalenedicarboxylic anhydride and the like.

These aromatic dicarboxylic anhydrides are used herein either singly or as combined.

The amount of the aromatic dicarboxylic anhydride to be used is in the range of 0.001 to 1.0 mol per mol of all the diamine compound. Preferably, it is in the range 0.01 to 0.5 mols.

The aromatic monoamine of the formula (17) includes, for example, aniline, toluidines, xylidines, chloro-anilines, bromo-anilines, nitro-anilines, amino-phenols, anisidines, phenetidines, aminobenzaldehydes, aminobenzonitriles, aminobiphenyls, aminophenylphenylethers, aminobenzophenones, aminophenylphynolsulfides, aminophenylphenylsulfones, naphthylamines, aminonaphthols and aminoanthracenes, These aromatic monoamines may be substituted with a substituent not reactive with amines and dicarboxylic acid anhydrides. These aromatic monoamines may be used herein either singly or as combined.

Like that of the aromatic dicarboxylic acid anhydride, the amount of the aromatic monoamine to be used is in the range of 0.001 to 1.0 mol per mol of all the tetracarboxylic dianhydride. Preferably, it is in the range of 0.01 to 0.5 mols.

The mode of blocking the molecular terminals of the polyimide copolymer of the invention is as follows:

<1> In one case, an excess of the diamine compound is used and the terminals are blocked with an aromatic dicarboxylic anhydride. In this case, the amount of the tetracarboxylic dianhydride is from 0.9 to smaller than 1.0 mol and that of the aromatic dicarboxylic anhydride is from 0.001 to 1.0 mol, per mol of the diamine compound.

<2> In the other case, an excess of the tetracarboxylic dianhydride is used and the terminals are blocked with an aromatic monoamine. In this case, the amount of the diamine compound is from 0.9 to smaller than 1.0 mol and that of the aromatic monoamine is from 0.001 to 1.0 mol, per mol of the tetracarboxylic acid dianhydride.

In case where the molar ratio of all the diamine compound to the tetracarboxylic dianhydride is defined to be in the range of 0.9 to 1.1, the molecular weight of the polyamic acid to be obtained will be as follows: Specifically, the inherent viscosity of the polyamic acid, measured in a solvent of N-methyl-2-pyrrolidone having the acid concentration of 0.5 g/dl at 35° C., is in the range of 0.1 to 3.0 dl/g.

The polyimide of the invention is a copolymer, and the configuration of two or more repeating units that constitute is not specifically defined in point of the sequential control and the regularity of the repeating units, or that is, the copolymer is a random copolymer. Accordingly, when diamines and tetracarboxylic dianhydrides of three or more different types in all are reacted to produce the copolymer, the order of adding the monomers to a reactor is not specifically defined, and the monomers may be added thereto all at a time or successively in divided portions.

The reaction to form the polyamic acid copolymer is generally carried out in an organic solvent. The organic solvent may be any ordinary one, including a) phenol based solvent; phenol, o-chlorophenol, m-chlorophenol, p-chlorophenol, o-cresol, m-cresol, p-cresol, 2,3-xylenol, 2,4-xylenol, 2,5-xylenol, 2,6-xylenol, 3,4-xylenol, 3,5-xylenol, and the like, b) aprotic amide based solvent; N,N-dimethylformamide, N,N-dimethylacetoamide, N,N-diethylacetoamide, N-methyl-2-pyrolidone, 1,3-dimethyl-2-imidazolodinone, N-methyl caprolactam, hexamethylphosphotriamide and the like, c) ether based solvent; 1,2-dimethoxyethane, bis(2-methoxyethyl)ether, 1,2-bis(2-methoxyethoxy)ethane, tetrahydrofuran, bis[2-(2-methoxyethoxy)ethyl]ether, 1,4-dioxane and the like, d) amine based solvent; Pyridine, quinoline, isoquinoline, α-picoline, β-picoline, γ-picoline, isophorone, piperidine, 2,4-rutidine, 2,6-rutidine, trimethylamine, triethylamine, tripropylamine, tributylamine and the like, and e) other solvent; dimethylsulfoxide, dimethylsulfone, diphenylether, sulforan, diphenylsulfone, tetramethylurea, anisole and the like.

These solvents may be used either singly or as combined. Of those, preferred are aprotic amide solvents; and most preferred are N,N-dimethylformamide, N,N-dimethylacetamide, and N-methyl-2-pyrrolidone.

The concentration of the reaction to be carried out in these solvents (this is hereinafter referred to as a polymerization concentration) is not specifically limited at all.

In the invention, the polymerization concentration in a solvent is defined as the ratio in terms of percentage of the overall weight of all the diamine and all the tetracarboxylic acid dianhydride used to the sum total of the overall weight of all the solvent used and the overall weight of all the diamine and all the tetracarboxylic dianhydride used. Preferably, the polymerization concentration is in the range of 5 to 40%, more preferably in the range of 10 to 30%.

In the reaction to give the polyimide copolymer precursor, polyamic acid copolymer, the especially preferred reaction temperature, reaction time and reaction pressure are not specifically limited, and any known conditions may apply to these. Generally speaking, the reaction temperature preferably is in the range of −10 to 100° C. or so, more preferably in the range of around the freezing temperature to 60° C. or so, and most preferably in practice, it is in the range of 50 to 60° C. The reaction time varies depending on the type of the monomers used, the type of the solvent used and the reaction temperature, but preferably is in the range of 1 to 48 hours, more preferably in the range of 2 or 3 hours to over ten hours or so, and most preferably in practice, it is in the range of 4 to 10 hours. For the reaction pressure, normal pressure will be enough.

When the polyamic acid copolymer is analyzed for its molecular weight profile through gel permeation chromatography (GPC), it is desirable that the number-average molecular weight (Mn) of the copolymer is at least 45,000, more preferably is in the range of 45,000 to 200,000, the weight-average molecular weight (Mw) thereof is at least 60,000, more preferably is in the range of 60,000 to 450,000, and the molecular weight distribution thereof is in the range of 1.6 to 2.3.

The polyamic acid copolymer obtained according to the process mentioned above is dehydrated under heat (for thermal imidation) while removing the solvent from it to be a polyimide copolymer.

Concretely, a varnish of the polyamic acid copolymer is applied onto an inorganic substrate such as metal leaf or glass, using a coater or the like. The thickness of the polyamic acid copolymer varnish film to be formed on the substrate varies, depending on the solid concentration of the varnish, but is so controlled that the thickness of the polyimide film layer to be formed after the solvent removal and imidation is at most 1 mm, preferably at most 100 µm, more preferably at most 50 µm. The method of solvent removal is not specifically limited. For example, it is carried out under reduced pressure or in an inert atmosphere of nitrogen, helium, argon or the like, at a temperature not lower than the boiling point of the solvent used and enough for imidation. Concretely, when an aprotic amide based solvent is used, the temperature may be 200° C. or higher. The baking time is not also specifically defined. In general, it may be 2 hours or longer.

The circuit substrate of the invention is a laminate structure of the polyimide film of the invention and metal leaf, and on the side of the metal leaf of the laminate, a circuit is formed. The metal leaf for it may be any and every one generally used in flexible circuit substrates. In general, it is copper leaf or stainless steel leaf (SUS leaf). Though not specifically defined, the thickness of the metal leaf is generally at most 100 µm, preferably at most 50 µm. The surface of the metal leaf may be processed in any desired manner with no problem. For laminating the polyimide film and metal leaf, any known method is employable. Generally known are <1> a method of applying a polyamic acid varnish onto the surface of metal leaf followed by heating it for solvent removal and imidation to form a laminate of polyimide and metal leaf; and <2> a method of previously preparing a polyimide film followed by sticking it to metal leaf with a known adhesive to form a laminate of polyimide and metal leaf.

EXAMPLES

The invention is described in more detail with reference to the following Examples, which, however, are not intended to restrict the scope of the invention. The physical properties of the products were measured according to the methods mentioned below.

Inherent Viscosity (ηinh):

A polyamic acid to be measured is dissolved in a solvent of N-methyl-2-pyrrolidone to have a solid concentration of 0.5 g/dl. The polymer solution is measured at 35° C.

E-type Mechanical Viscosity:

Measured at 25° C. by using a Toki Sangyo's E-type mechanical viscometer.

Molecular Weight:

Measured at 50° C. by using a Showa Denko's GPC SHODEX SYSTEM-21 with a column GPC-805. The eluent is LiBr (6 mM)-85% phosphoric acid (6 mM) 5 DM solution; the monitor wavelength is 270 nm; and the sample flow rate is 1.0 ml/ml.

Glass Transition Temperature (Tg):

Measured in nitrogen by using a Seiko's thermal analyzer, DSC3000 Series.

5% Weight Loss Temperature (Td5):

Measured in air by using a Seiko's thermal analyzer, DTA-TG 3000 Series.

Linear Expansion Coefficient:

Measured in nitrogen in a temperature range of 100 to 200° C. by using a Mac Science's thermal analyzer, TMA Series.

Tensile Strength (TS), Tensile Modulus (TM), Elongation (EL):

Using a Shimadzu Seisakusho's tensile tester EZ-TEST (for 100 N), the sample is tested.

Dielectric Constant:

Measured at room temperature, according to ASTM-150D.

Volume Resistivity, Surface Resistivity:

Measured at room temperature by using a Hewlett-Packard's surface resistivity and volume resistivity meter.

Storage Stability of Varnish:

The varnishes obtained in Examples and Comparative Examples are stored in a refrigerator at 5° C. for 3 months, and their condition is visually checked. With no change, the samples are good (◯); partly solidified and whitened, the samples are not so good (Δ); and completely solidified and gelled, the samples are bad (×).

Example 1

6.01 g (0.030 mols) of 4,4'-oxydianiline (hereinafter ODA), 7.57 g (0.070 mols) of paraphenylenediamine (hereinafter pPD) and 120.68 g of a solvent, N-methyl-2-pyrrolidone (hereinafter NMP) having a water content of 300 ppm were fed into a flask equipped with a stirrer, a nitrogen-introducing duct, and completely dissolved. Next, this was once cooled to around room temperature, and 21.59 g (0.099 mols) of pyromellitic acid dianhydride (hereinafter PMDA) was added thereto, while watching the temperature elevation. In this stage, the inner temperature rose from around room temperature to 55° C. The contents of the reactor were washed with 20 g of NMP, and after completely dissolved, they were reacted at 60° C. for 6 hours. In this stage, the contents became a highly viscous varnish. After the reaction, the varnish was filtered under pressure through a 5μ-filter to obtain a polyamic acid varnish. The polyamic acid had an inherent viscosity (ηinh) of 1.24 dl/g, an E-type mechanical viscosity of 66800 mPa·s, a number-average molecular weight (Mn) of 102600, a weight-average molecular weight (Mw) of 204100, and a molecular weight distribution (Mw/Mn) of 1.99.

The polyamic acid varnish was cast on a glass sheet to form a layer thereon having a thickness of 0.20 mm, heated in a nitrogen-purged inert oven from room temperature up to 250° C. over a period of 2 hours, and baked at 250° C. for 2 hours. After cooled to room temperature, the polyimide film formed was peeled from the glass sheet, and its thickness was measured and was 30 μm. In its thermal analysis, the polyimide film had no glass transition temperature (Tg) and its 5% weight loss temperature (Td5) was 534° C. in air. The linear expansion coefficient of the polyimide film was 10 ppm/K in a temperature range of 100 to 200° C.

Regarding its mechanical properties, the polyimide film had a tensile strength (TS) of 16.4 kgf/mm$^2$, a tensile modulus (TM) of 396 kgf/mm$^2$, and an elongation (EL) of 11%. Regarding its electric properties, the polyimide film had a dielectric constant of 3.7, a volume resistivity of larger than $10^{16}$ Ω·cm, and a surface resistivity of larger than $10^{16}$ Ω.

After stored in a refrigerator at 5° C. for 3 months, the polyamic acid varnish obtained in this Example did not change at all.

The test data of this Example are given in Table 1 along with the test data of the other Examples.

Examples 2 to 12

Polyamic acid varnishes and polyimide films were obtained in the same manner as in Example 1, for which, however, the compositions of the diamine components to be used were varied as in Table 1. The test data of these Examples are summarized in Table 1.

Comparative Example 1

A polyamic acid varnish was obtained in the same manner as in Example 1, for which, however, the diamine component to be used was varied to pPD, 10.81 g (0.100 mols). The polyamic acid had ηinh of 0.88 dl/g, and an E-type mechanical viscosity of 38500 mPa·s.

Forming a film of the polyamic acid varnish was tried in the same manner as in Example 1, but a polyimide film enough for evaluation could not be obtained since the varnish did not have film-forming ability. The test data of Comparative Example 1 are summarized in Table 2.

Comparative Examples 2 to 18

Polyamic acid varnishes and polyimide films (some varnishes did not have film-forming ability) were obtained in the same manner as in Example 1 and Comparative Example 1, for which, however, the compositions of the diamine components in Comparative Example 1 to be used were varied as in Table 2. The test data of these Comparative Examples are summarized in Table 2.

Example 13

The polyamic acid varnish obtained in Example 1 was cast on copper leaf of 25 μm thick (its linear expansion coefficient at 100 to 200° C. is 17 ppm/K) to form a layer thereon having a thickness of 0.20 mm, heated in a nitrogen-purged inert oven from room temperature up to 250° C. over a period of 2 hours, and baked at 250° C. for 2 hours. After cooled to room temperature, obtained was a laminate of polyimide film and copper leaf. Not warped, deformed and curled, the laminate was almost flat. The test data of this Example are given in Table 3.

Examples 14 to 16

The polyamic acid varnishes obtained in Examples 5, 7 and 10 were separately cast on copper leaf and processed in the same manner as in Example 13 to obtain laminates of polyimide film and copper leaf. Like that of Example 13, all these laminates were almost flat, not warped, deformed and curled. Like those of Example 13, the test data of these Examples are given in Table 3.

Comparative Examples 19 to 25

The polyamic acid varnishes obtained in Comparative Examples 3 to 5, 11, 14, 16 and 18 were separately cast on copper leaf in the same manner as in Example 13 to obtain laminates of polyimide film and copper leaf. The laminates were warped, deformed and curled, and were not flat. Along with those of Examples 13 to 16, the test data of these Comparative Examples are given in Table 3.

TABLE 1

| EXAMPLE NO. | DIAMINE COMPOSITION | POLYMER CONCENTRATION (wt %) | ηinh (dl/g) | E-TYPE MECHANICAL VISCOSITY (mPa/s) | Tg (° C.) | Td5 (° C.) | LINEAR EXPANSION COEFFICIENCY (ppm/K) | TS (kgf/mm$^2$) |
|---|---|---|---|---|---|---|---|---|
| 1 | = 0.70/0.30 | 18 | 1.24 | 66800 | ND | 534 | 10 | 16.4 |
| 2 | pPD/ODA = 0.60/0.40 | ↑ | 1.12 | 44800 | ND | 534 | 12 | 16.0 |
| 3 | pPD/ODA = 0.80/0.20 | ↑ | 1.18 | 55000 | ND | 536 | 10 | 18.2 |
| 4 | pPD/mPD/ODA = 0.60/0.30/0.10 | ↑ | 0.75 | 15300 | ND | 530 | 14 | 15.0 |
| 5 | pPD/mPD/ODA = 0.70/0.20/0.10 | ↑ | 0.80 | 20500 | ND | 530 | 15 | 15.6 |
| 6 | pPD/mPD/ODA = 0.80/0.10/0.10 | ↑ | 0.84 | 26500 | ND | 530 | 13 | 9.7 |
| 7 | pPD/NBDA/ODA = 0.70/0.20/0.10 | 20 | 0.68 | 10650 | ND | 477 | 16 | 11.4 |
| 8 | pPD/NBDA/ODA = 0.65/0.25/0.10 | ↑ | 0.74 | 14700 | ND | 468 | 18 | 12.3 |
| 9 | pPD/NBDA/ODA = 0.75/0.15/0.10 | ↑ | 0.82 | 16300 | ND | 507 | 14 | 13.3 |
| 10 | pPD/mPD/NBDA = 0.70/0.20/0.10 | ↑ | 0.65 | 9700 | ND | 488 | 18 | 12.1 |
| 11 | pPD/mPD/NBDA = 0.65/0.25/0.10 | ↑ | 0.61 | 8800 | ND | 486 | 19 | 12.3 |
| 12 | pPD/mPD/NBDA = 0.75/0.15/0.10 | ↑ | 0.70 | 10800 | ND | 502 | 16 | 13.2 |

| EXAMPLE NO. | TM (kgf/mm$^2$) | EL (%) | DIELECTRIC COEFFICIENT | VOLUME RESISTIVITY (Ω · cm) | SURFACE RESISTIVITY (Ω) | STORAGE STABILITY OF VARNISH | Mn | Mw | Mw/Mn |
|---|---|---|---|---|---|---|---|---|---|
| 1 | 396 | 11 | 3.7 | >10$^{16}$ | >10$^{16}$ | ○ | 102600 | 204100 | 1.99 |
| 2 | 390 | 18 | 3.6 | >10$^{17}$ | >10$^{16}$ | ○ | 90000 | 180000 | 2.00 |
| 3 | 463 | 11 | 3.7 | >10$^{17}$ | >10$^{17}$ | ○ | 101100 | 192100 | 1.90 |
| 4 | 398 | 7 | 3.6 | >10$^{17}$ | >10$^{16}$ | ○ | 52700 | 105400 | 2.00 |
| 5 | 426 | 8 | 3.6 | >10$^{16}$ | >10$^{16}$ | ○ | 60800 | 115500 | 1.90 |
| 6 | 412 | 4 | 3.7 | >10$^{16}$ | >10$^{16}$ | ○ | 66800 | 123500 | 1.85 |
| 7 | 231 | 17 | 3.6 | >10$^{16}$ | >10$^{17}$ | ○ | 43100 | 91300 | 2.12 |
| 8 | 286 | 16 | 3.5 | >10$^{16}$ | >10$^{16}$ | ○ | 51400 | 103400 | 2.01 |
| 9 | 298 | 13 | 3.6 | >10$^{17}$ | >10$^{17}$ | ○ | 61300 | 119500 | 1.95 |
| 10 | 282 | 9 | 3.6 | >10$^{17}$ | >10$^{17}$ | ○ | 47300 | 85200 | 1.80 |
| 11 | 294 | 10 | 3.5 | >10$^{16}$ | >10$^{16}$ | ○ | 44900 | 77200 | 1.72 |
| 12 | 306 | 10 | 3.6 | >10$^{16}$ | >10$^{17}$ | ○ | 50200 | 95300 | 1.90 |

Description of Terms:
ηinh: inherent viscosity
Tg: glass transition temperature
Td5: 5% weight loss temperature
TS: tensile strength
pPD: paraphenylenediamine
ODA: 4,4'-oxydianiline
mPD: metaphenylenediamine
NBDA: diaminomethyl-bicyclo[2.2.1]heptanes
TM: tensile modulus
EL: elongation
Varnish storage stability:
○: No change.
Δ: Partly solidified or whitened.
●: Completely solidified or gelled.
Mn: number-average molecular weight
Mw: weight-average molecular weight

TABLE 2

| COMPARATIVE EXAMPLE | DIAMINE COMPOSITION | POLYMER CONCENTRATION (WT %) | ηinh (dl/g) | E-TYPE MECHANICAL VISCOSITY (MPA · S) | Tg (° C.) | Td5 (° C.) | LINEAR EXPANSION COEFFICIENCY (ppm/K) | TS kgf/mm$^2$ |
|---|---|---|---|---|---|---|---|---|
| 1 | pPD = 1.00 | 20 | 0.88 | 38500 | ND | 510 | impossible to form file | |
| 2 | mPD = 1.00 | ↑ | 0.71 | 6930 | ND | 517 | 27 | 10.1 |
| 3 | ODA = 1.00 | ↑ | 0.67 | 5530 | ND | 548 | 38 | 14.2 |
| 4 | NBDA = 1.00 | ↑ | 0.37 | 640 | 292 | 436 | 60 | 10.1 |
| 5 | pPD/ODA = 0.50/0.50 | ↑ | 1.26 | 19100 | ND | 546 | 24 | 14.4 |
| 6 | pPD/ODA = 0.90/0.10 | ↑ | 1.05 | 18700 | ND | 540 | impossible to form film | |

TABLE 2-continued

| | | | | | | | | |
|---|---|---|---|---|---|---|---|---|
| 7 | pPD/mPD = 0.50/0.50 | 20 | 0.81 | 9200 | ND | 519 | | |
| 8 | pPD/mPD = 0.80/0.20 | ↑ | 0.66 | 7420 | ND | 523 | | |
| 9 | mPD/ODA = 0.70/0.30 | ↑ | 1.09 | 61900 | ND | 533 | 33 | 12.4 |
| 10 | mPD/ODA = 0.50/0.50 | ↑ | 0.98 | 33900 | ND | 517 | 34 | 9.7 |
| 11 | pPD/NBDA = 0.30/0.70 | ↑ | 0.62 | 5660 | 334 | 398 | 49 | 9.2 |
| 12 | pPD/NBDA = 0.50/0.50 | ↑ | 0.85 | 16000 | ND | 418 | impossible to form film | |
| 13 | pPD/NBDA/ODA = 0.80/0.10/0.10 | ↑ | 0.80 | 20200 | ND | 508 | | |
| 14 | pPD/NBDA/ODA = 0.60/0.30/0.10 | ↑ | 0.60 | 7100 | ND | 443 | 27 | 10.0 |
| 15 | mPD/NBDA = 0.30/0.70 | ↑ | 0.73 | 7600 | ND | 427 | 47 | 9.9 |
| 16 | mPD/NBDA = 0.50/0.50 | ↑ | 2.03 | 115000 | ND | 418 | 40 | 10.6 |
| 17 | pPD/mPD/NBDA = 0.80/0.10/0.10 | ↑ | 0.73 | 11500 | ND | 496 | impossible to form film | |
| 18 | pPD/mPD/NBDA = 0.60/0.30/0.10 | ↑ | 0.58 | 6200 | ND | 488 | 28 | 10.2 |

| EXAMPLE NO. | TM (kgf/mm²) | EL (%) | DIELECTRIC COEFFICIENT | VOLUME RESISTIVITY (Ω·cm) | SURFACE RESISTIVITY (Ω) | STORAGE STABILITY OF VARNISH |
|---|---|---|---|---|---|---|
| 1 | | | | impossible to form film | | X |
| 2 | 189 | 7 | 3.8 | >$10^{17}$ | >$10^{17}$ | X |
| 3 | 190 | 55 | 3.6 | >$10^{16}$ | >$10^{16}$ | ○ |
| 4 | 189 | 8 | 3 | >$10^{16}$ | >$10^{16}$ | ○ |
| 5 | 283 | 18 | 3.7 | >$10^{17}$ | >$10^{16}$ | ○ |
| 6 | | | | impossible to form film | | X |
| 7 | | | | | | X |
| 8 | | | | | | X |
| 9 | 197 | 31 | 3.6 | >$10^{16}$ | >$10^{16}$ | ○ |
| 10 | 202 | 11 | 3.6 | >$10^{16}$ | >$10^{17}$ | Δ |
| 11 | 14.5 | 7 | 3.4 | >$10^{16}$ | >$10^{17}$ | ○ |
| 12 | | | | impossible to form film | | Δ |
| 13 | | | | | | Δ |
| 14 | 170 | 28 | 3.4 | >$10^{16}$ | >$10^{16}$ | ○ |
| 15 | 188 | 10 | 3.6 | >$10^{16}$ | >$10^{16}$ | ○ |
| 16 | 141 | 10 | 3.5 | >$10^{17}$ | >$10^{16}$ | Δ |
| 17 | | | | impossible to form film | | Δ |
| 18 | 177 | 11 | 3.7 | >$10^{16}$ | >$10^{16}$ | ○ |

TABLE 3

| | Used varnish | Situation of laminate |
|---|---|---|
| Example | | |
| 13 | Example 1 | ○ |
| 14 | Example 5 | ○ |
| 15 | Example 7 | ○ |
| 16 | Example 10 | ○ |
| Comparative Example | | |
| 19 | Comparative Example 3 | X |
| 20 | Comparative Example 4 | X |
| 21 | Comparative Example 5 | Δ |
| 22 | Comparative Example 11 | Δ |
| 23 | Comparative Example 14 | Δ |
| 24 | Comparative Example 16 | Δ |
| 25 | Comparative Example 18 | Δ |

○: Not warped, deformed and curled.
Δ: Partly warped, deformed and curled.
X: Much warped, deformed and curled.

INDUSTRIAL APPLICABILITY

According to the present invention, there was found out a polyimide having a suitable linear expansion coefficient that corresponds to the linear expansion coefficient of metal leaf (in this case, falling between 10 and 20 ppm/K at a temperature falling between 100 and 200° C.). More precisely, there was found out a useful polyimide which can be a polyimide circuit substrate material capable of keeping flat, neither shrinking nor expanding in its laminate.

What is claimed:

1. A polyimide, which is a random copolymer having repeating units of the formula (1):

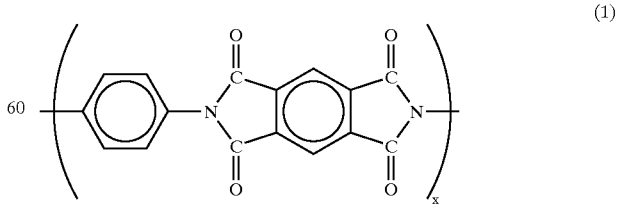

-continued

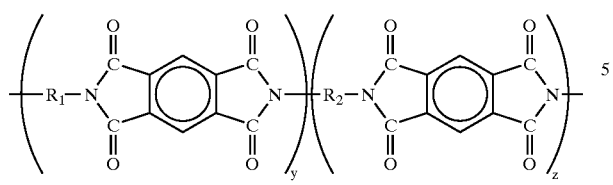

wherein $R_1$ and $R_2$ each represent a divalent group selected from

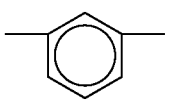

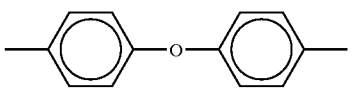

and $R_1$ and $R_2$ are different; and x=0.60 to 0.80, y+z=0.40 to 0.20, and x+y+z=1.00,
and which has a linear expansion coefficient of the range of 10 to 20 ppm/K at 100 to 200° C.

2. The polyimide of claim 1, which is a random copolymer having repeating units of the formula (3):

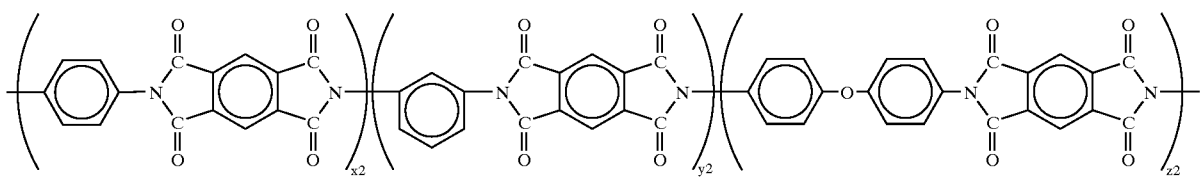

(3)

wherein x2=0.60 to 0.80, y2=0.35 to 0.05, z2=0.05 to 0.15, and x2+y2+z2=1.00, and which has a linear expansion coefficient of the range of 10 to 20 ppm/K at 100 to 200° C.

3. The polyimide of claim 1, which is a random copolymer having repeating units of the formula (4):

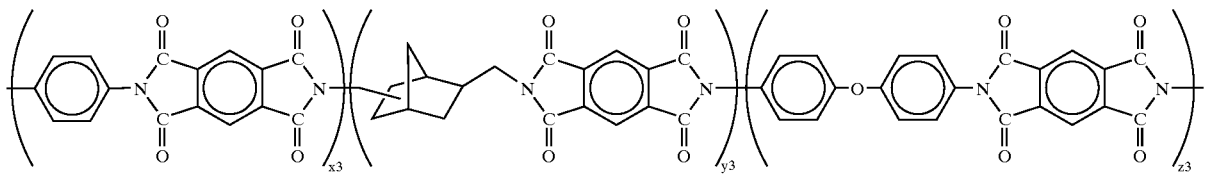

(4)

wherein x3=0.65 to 0.75, y3=0.30 to 0.10, z3=0.05 to 0.15, and x3+y3+z3=1.00, and which has a linear expansion coefficient of the range of 10 to 20 ppm/K at 100 to 200° C.

4. The polyimide of claim 1, which is a random copolymer having repeating units of the formula (5):

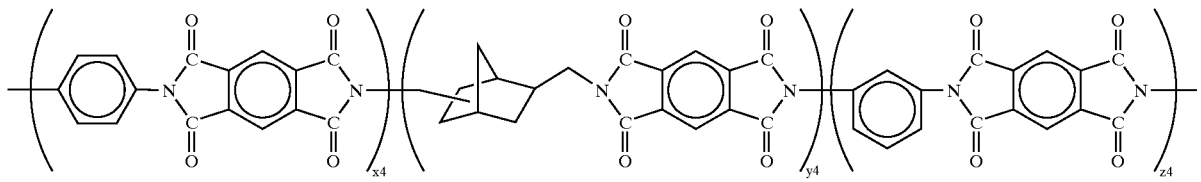

(5)

wherein x4=065 to 0.75, y4=0.05 to 0.15, z4=0.30 to 0.10, and x4+y4+z4=1.00, and which has a linear expansion coefficient of the range of 10 to 20 ppm/K at 100 to 200° C.

5. The polyimide of claim 1, of which the precursor, polyamic acid has a number-average molecular weight (Mn) of at least 40,000, a weight-average molecular weight (Mw) of at least 60,000, and a molecular weight distribution (Mw/Mn) falling between 1.6 and 2.3.

6. A process for preparing the polyimide of claim 1, which comprises reacting 1 equivalent mol of pyromellitic acid dianhydride of the formula (6):

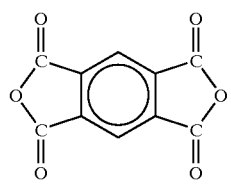

(6)

with from 0.9 to 1.1 equivalent mols of a diamine mixture that comprises from 60 to 80 mol % of a diamine of the formula (7):

(7)

and from 40 to 20 mol % of diamines of formulae (16) and (17):

H₂N—R₁—NH₂ (16)

H₂N—R₂—NH₂ (17)

wherein R₁ and R₂ each represent a divalent group selected from

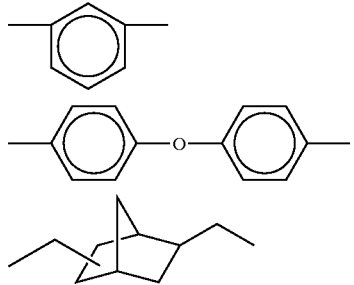

and R₁ and R₂ are different, in an organic solvent, followed by thermally imidizing the resulting random copolymer, polyamic acid having repeating units of the formula (15):

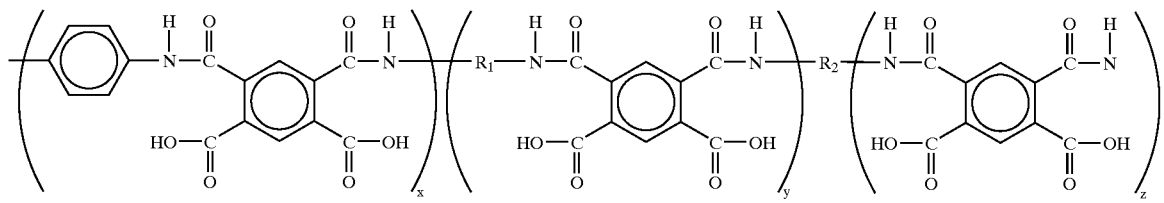

(15)

wherein R₁ and R₂ each represent a divalent group selected from

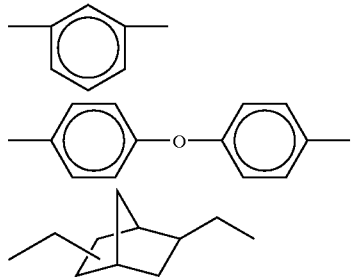

and R₁ and R₂ are different; and x=0.60 to 0.80, y+z=0.40 to 0.20, and x+y+z=1.00.

7. A process for preparing the polyimide of claim 2, which comprises reacting 1 equivalent mol of pyromellitic acid dianhydride of the formula (6):

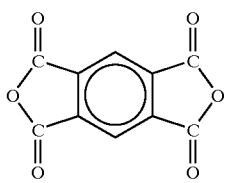
(6)

with from 0.9 to 1.1 equivalent mols of a diamine mixture that comprises from 60 to 80 mol % of paraphenylenediamine of the formula (7):

(7)

from 5 to 15 mol % of 4,4'-oxydianiline of the formula (8):

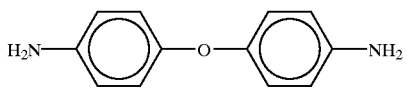
(8)

and from 35 to 5 mol % of metaphenylenediamine of the formula (10):

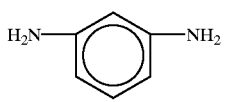
(10)

in an organic solvent, followed by thermally imidizing the resulting random copolymer, polyamic acid having repeating units of the formula (11):

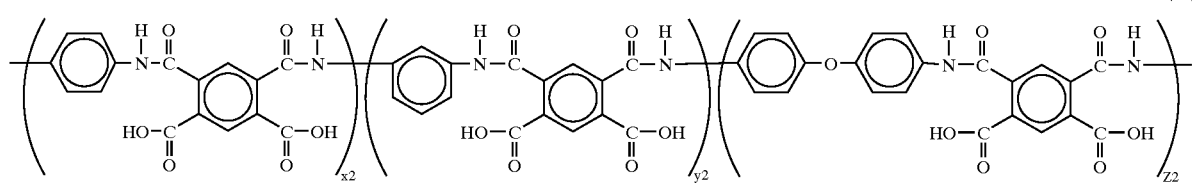
(11)

wherein x2=0.60 to 0.80, y2=0.35 to 0.05, z2=0.05 to 0.15, and x2+y2+z2=1.00.

8. A process for preparing the polyimide of claim 3, which comprises reacting 1 equivalent mol of pyromellitic acid dianhydride of the formula (6):

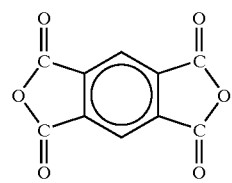
(6)

with from 0.9 to 1.1 equivalent mols of a diamine mixture that comprises from 65 to 75 mol % of paraphenylenediamine of the formula (7):

(7)

from 5 to 15 mol % of 4,4'-oxydianiline of the formula (8):

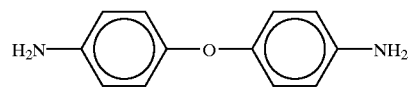
(8)

and from 30 to 10 mol % of diaminomethyl-bicyclo[2.2.1] heptanes of the formula (12):

(12)

in an organic solvent, followed by thermally imidizing the resulting random copolymer, polyamic acid having repeating units of the formula (13):

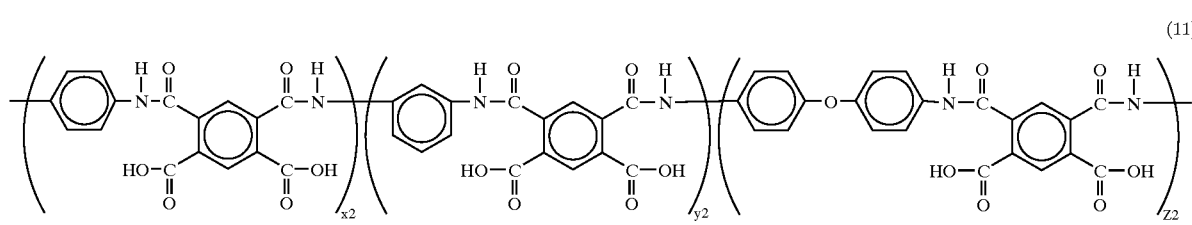
(13)

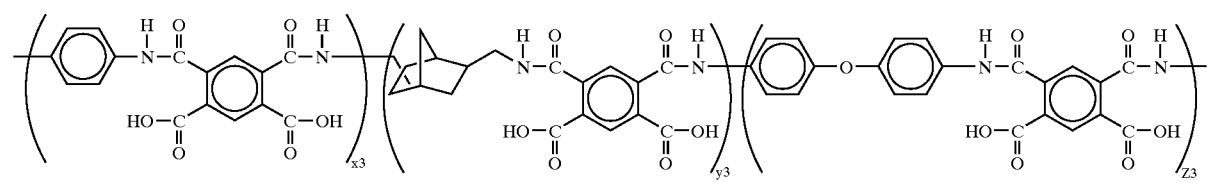

wherein x3=0.65 to 0.75, y3=0.30 to 0.10, z3=0.05 to 0.15, and x3+y3+z3=1.00.

9. A process for preparing the polyimide of claim 4, which comprises reacting 1 equivalent mol of pyromellitic acid dianhydride of the formula (6):

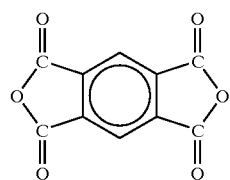
(6)

with from 0.9 to 1.1 equivalent mols of a diamine mixture that comprises from 65 to 75 mol % of paraphenylenediamine of the formula (7):

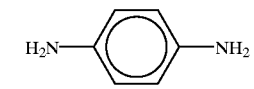
(7)

from 30 to 10 mol % of metaphenylenediamine of the formula (10):

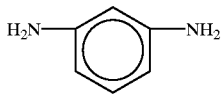
(10)

and from 5 to 15 mol % of diaminomethyl-bicyclo[2.2.1] heptanes of the formula (12):

(12)

in an organic solvent, followed by thermally imidizing the resulting random copolymer, polyamic acid having repeating units of the formula (14):

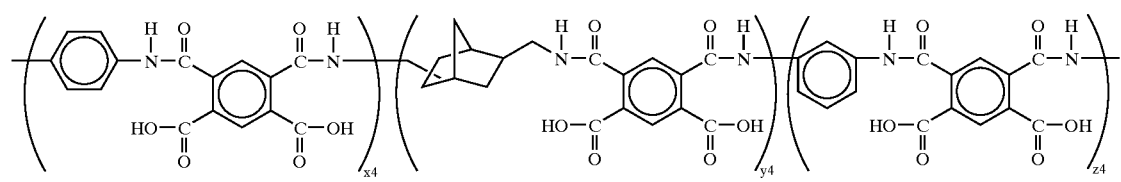
(14)

wherein x4=0.65 to 0.75, y4=0.05 to 0.15, z4=0.30 to 0.10, and x4+y4+z4=1.00.

10. A polyamic acid varnish, which contains a precursor of the polyimide of claim 1, or that is, a random copolymer, polyamic acid having repeating units of the formula (15):

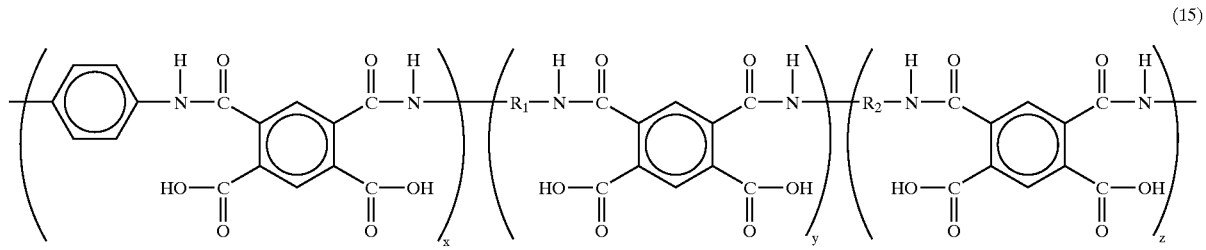
(15)

wherein $R_1$ and $R_2$ each represent a divalent group selected from
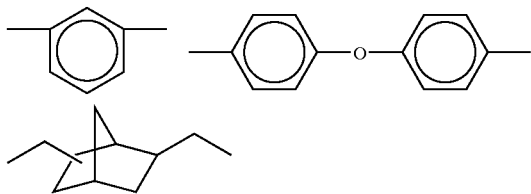
and $R_1$ and $R_2$ are different; and x=0.60 to 0.80, y+z=0.40 to 0.20, and x+y+z=1.00.
11. A polyimide film containing the polyimide of claim 1.
12. A polyimide circuit substrate, which is a laminate of the polyimide of claim 1 and metal leaf.
* * * * *